United States Patent [19]

Miura et al.

[11] Patent Number: 4,496,902
[45] Date of Patent: Jan. 29, 1985

[54] TAUT BAND TYPE INSTRUMENT SUITABLE FOR AUTOMATICAL ASSEMBLY

[75] Inventors: Shigetaka Miura; Junichi Igawa; Satoru Takata, all of Tokyo, Japan

[73] Assignee: Yokogawa Hokushin Electric Corporation, Tokyo, Japan

[21] Appl. No.: 377,711

[22] Filed: May 13, 1982

[30] Foreign Application Priority Data

May 20, 1981 [JP] Japan ................... 56-75037

[51] Int. Cl.³ .......................... G01R 5/02; G01R 5/08
[52] U.S. Cl. .................................. 324/150; 324/154 R
[58] Field of Search ............. 324/154 R, 154 PB, 155, 324/150, 151

[56] References Cited

U.S. PATENT DOCUMENTS

| | | | |
|---|---|---|---|
| 3,237,103 | 2/1966 | Kunz et al. | 324/150 |
| 3,586,976 | 6/1971 | Woolner | 324/154 R |
| 3,597,686 | 8/1971 | Kain et al. | 324/154 R |
| 3,624,505 | 11/1971 | Boreas | 324/154 R |
| 3,678,383 | 7/1972 | Boreas | 324/154 R |
| 3,771,489 | 11/1973 | Pearson | 324/154 PB |
| 3,878,462 | 4/1975 | Orth et al. | 324/154 |
| 3,891,923 | 6/1975 | Sakaguchi | 324/154 R |
| 3,899,736 | 8/1975 | Sakaguchi | 324/154 R |
| 4,140,969 | 2/1979 | Boreas | 324/154 R |

FOREIGN PATENT DOCUMENTS

| | | | |
|---|---|---|---|
| 908748 | 8/1972 | Canada | 324/154 R |
| 395373 | 5/1929 | Fed. Rep. of Germany | 324/150 |
| 14100 | 7/1967 | Japan | 324/154 R |
| 141563 | 11/1981 | Japan | 324/154 R |
| 423052 | 4/1971 | U.S.S.R. | 324/150 |

*Primary Examiner*—Gerard R. Strecker
*Assistant Examiner*—Warren S. Edmonds
*Attorney, Agent, or Firm*—Moonray Kojima

[57] ABSTRACT

A taut band type instrument comprising a support member supporting thereon a moving coil, a pair of clips electrically connected to the moving coil and mounted on the support member in mutually spaced relation, a pair of upper and lower boss stoppers each having an integral cylindrical portion with a recess defined axially therein and mounted on a bridge, a pair of tension springs mounted respectively on the boss stoppers, a taut band attached to and disposed between the tension springs under a predetermined tension, and soldered to the clips so as to be positioned in the cylindrical portions of the boss stoppers through the recesses therein, a pointer attachment joined to the support member, and a pointer attached to the pointer attachment. The taut band is cut between the clips after it has been soldered to the clips.

2 Claims, 11 Drawing Figures

TAUT BAND TYPE INSTRUMENT SUITABLE FOR AUTOMATICAL ASSEMBLY

BACKGROUND OF THE INVENTION

1. Field of the Invention

This invention relates to a taut band type instrument, and more particularly to such an instrument which is of thin configuration and which can automatically be assembled using a machine.

2. Description of the Prior Art

Taut band type instruments usually comprise a moving unit suspended by a pair of upper and lower taut bands. One known type of such instrument comprises one end of each of the upper and lower bands being attached to bosses through slits defined therein, and the other ends of such bands being fixed to tension springs through holes defined in boss stoppers and a bridge which supports the boss stoppers, thereby suspending the moving unit.

In the event such taut band type instrument is assembled using a machine, it would be difficult for the machine to automatically thread the taut bands through the slits or holes. Thus, it is preferable, and necessary, for automatic machine assembly, that the threading of the taut bands through holes or slits, be eliminated.

SUMMARY OF THE INVENTION

Accordingly, it is an object of the invention to provide a taut band type instrument, wherein the necessity of threading the taut band through holes or slits is eliminated, thereby enabling efficient simple automatic assembly by use of a machine.

The foregoing and other objects of the invention are attained in a taut band type instrument comprising a moving coil, a support member supporting the moving coil, a pair of clips electrically connected to the moving coil and mounted on the support member in mutually spaced relationship, a bridge, a pair of upper and lower boss stoppers, each having an integral cylindrical portion with a recess defined axially therein and mounted on the bridge, a pair of tension springs mounted, respectively, on the boss stoppers, a taut band attached to and disposed between the tension springs under a predetermined tension and soldered to the clips, the taut band being positioned in the cylindrical portions of the boss stoppers through the recesses therein, a pointer attachment joined to the support member, and a pointer attached to the pointer attachment. The taut band is cut off between the clips, after it has been soldered to the clips.

The above and other objects, features, and advantages, of the invention will become more apparent from the following description when taken in conjunction with the accompanying drawings in which a certain preferred embodiment of the invention is shown by way of an illustrative example.

DETAILED DESCRIPTION OF PREFERRED EMBODIMENTS

Figure 1:
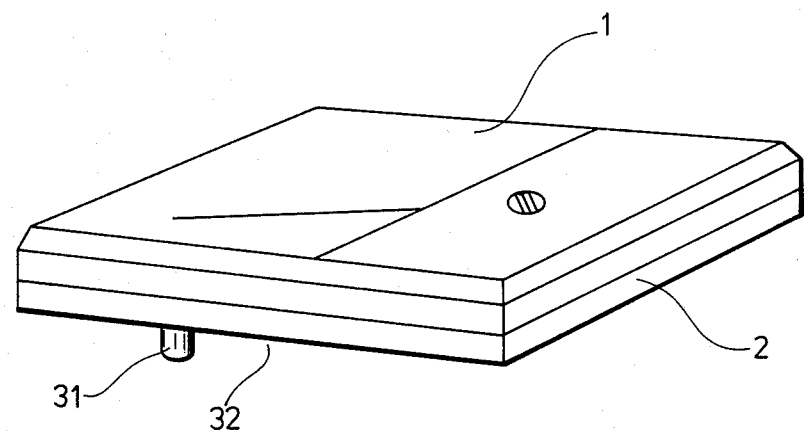
FIG. 1 is a perspective view depicting a taut band instrument casing which holds the taut band type mechanism.

FIG. 1 shows an assembled taut band type instrument constructed in accordance with the invention. The depicted taut band type instrument comprises a transparent cover 1, made for example of plastic, having upper corners and edges bevelled, as depicted, and a non-transparent, for example, being of black color, base 2, made, for example, of plastic, over which cover 1 is fitted with snap or press action, and external terminals 31 and 32 (note terminal 32 is on the bottom of base 2 next to terminal 31, but hidden in the perspective view). Cover 1 and base 2 jointly constitute a casing in which the inventive mechanism, such as described in detail hereinbelow, is housed.

Figure 2A:
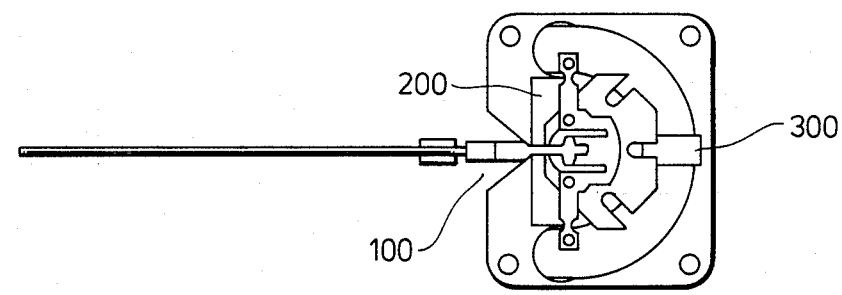
FIGS. 2A, and 2B are plan and side views, respectively, depicting an illustrative embodiment of the invention and showing the instrument mechanisms thereof.
Figure 2B:
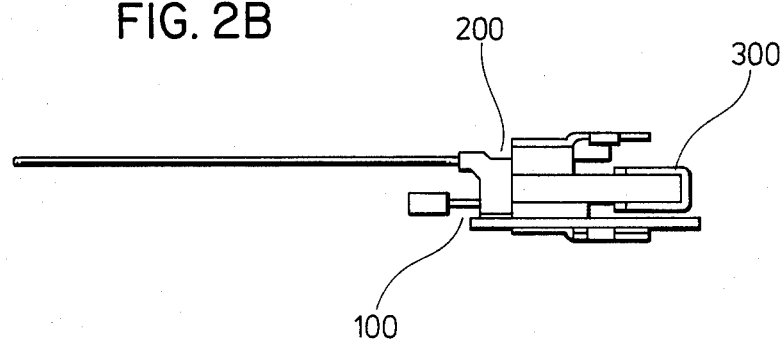
Figure 3:
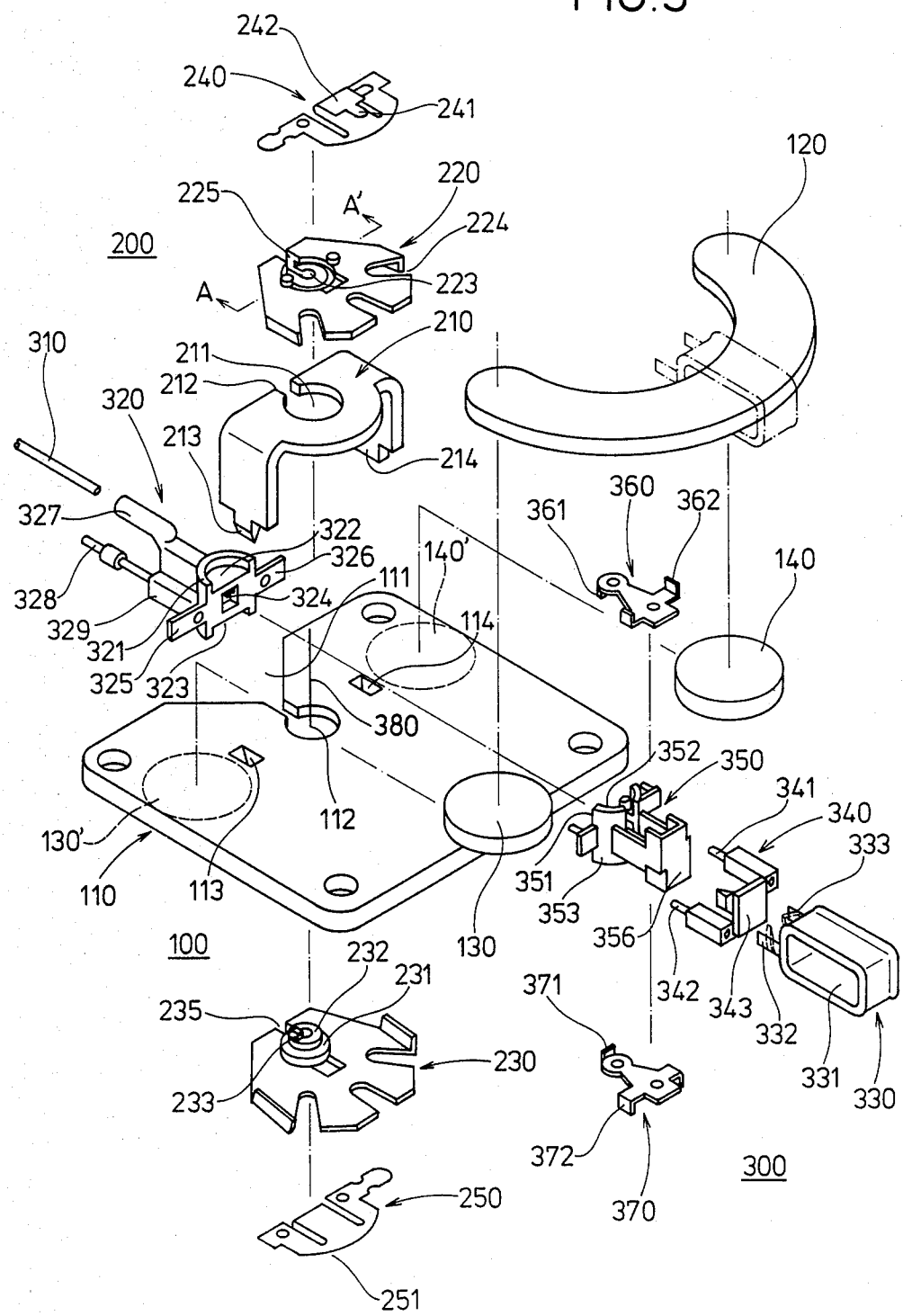
FIG. 3 is an exploded perspective view depicting the embodiment of FIGS. 2A and 2B.

FIGS. 2A and 2B are illustrative of the instrument mechanism according to our illustrative embodiment of the invention. The instrument comprises an exciting unit 100, a bridge unit 200, and a moving unit 300, which are assembled together. These units will individually be described in detail with reference to FIG. 3.

Exciting Unit 100

The exciting unit 100 comprises a yoke 110 in the form of a plate, a semi-annular core 120, and a pair of permanent magnets 130 and 140. The yoke 110 has a triangular recess 111 and a circular hole 112 communicating therewith. The permanent magnets 130 and 140 are mounted on yoke 110 at the dotted line positions indicated respectively by reference numerals 130' and 140'. The core 120 is placed on permanent magnets 130 and 140 and bonded thereto, such as with an adhesive.

Bridge Unit 200

The bridge unit 200 comprises a bridge 210, a pair of upper and lower boss stoppers 220, 230 made of an insulating material, such as plastic, and a pair of upper and lower tension springs 240, 250 made of a resilient, springy material. Bridge 210 has a circular hole 211 defined centrally therein and communicating with the exterior through a slot 212. Bridge 210 is channel-shaped, and has a pair of legs 213, 214 which are insertable, respectively, in holes 113, 114 in yoke 110 and attachable thereto by staking.

Figure 4:
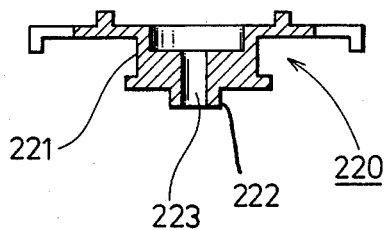
FIG. 4 depicts a cross-sectional view taken along lines A—A' in FIG. 3.

Boss stopper 220 is substantially sectorial in shape, and has on its reverse side a cylindrical portion 223 integral therewith. Cylindrical portion 223 comprises a larger diameter portion 221 and a smaller diameter portion 222, as shown in FIG. 4, which is a cross sectional view taken along line A—A'. Boss stopper 220 also has recesses 224 defined in its peripheral edge which are positioned at spaced intervals. Cylindrical portion 223 is held in communication with the exterior of boss stopper 220 via a recess 225 extending in the axial direction. Boss stopper 220 is mounted on bridge 210 with larger diameter portion 221 press fitted in hole 211 in bridge 210 from above. Lower boss stopper 230 is of substantially the same construction as that of upper boss stopper 220. Boss stopper 230 has a larger diameter portion 231 press fitted in hole 112 in yoke 110 from below. Boss stopper 230 is thus mounted on yoke 110.

Tension spring 240 has a central tongue 241 including a bent portion 242. Tension spring 240 is affixed to boss stopper 220, for example, by ultrasonic welding, with bent portion 242 positioned on cylindrical portion 223 of boss stopper 220. Lower tension spring 250 is of substantially the same configuration as that of upper tension spring 240, and is attached to lower boss stopper 230.

Moving Unit 300

The moving unit 300 comprises a pointer 310, a pointer attachment 320, a moving coil 330, a terminal assembly 340, a support member 350, a pair of upper and lower clips 360,370, and a taut band 380. Pointer attachment 320 has a base in the form of a semi-cylindrical member 321 made, for example of synthetic resin, and having upper and lower semi-circular cavities 322,323 and a central recess 324 defined in a flat surface of semi-cylindrical member 321. A pair of arms 325,326 extend from the flat surface in parallel relation thereto. With base 321, there are integrally formed, a pointer attaching member 327 to which pointer 310 is attached, and an attachment 329 on which a balancer arm 328 is mounted. Pointer attaching member 327 and attachment 329 extend perpendicularly to the flat surface of base 321.

Moving coil 330 includes a coil frame 331, made for example of aluminum, which has integral projections 332,333.

Figure 5:
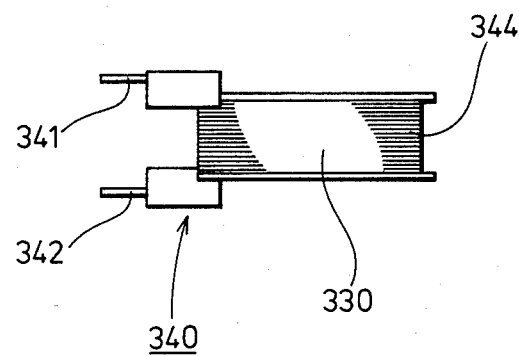
FIG. 5 is a plan view depicting a moving coil attached to a terminal assembly.

Terminal assembly 340 is made, for example, of synthetic resin and has a pair of terminals 341,342, disposed in diagonal relation to each other, as depicted. Coil frame 331 is mounted on terminal assembly 340 by being supported on body 343 of terminal assembly 340 and then by bending projections 332,333 inwardly as shown by the dotted lines (see FIG. 3). A coil 344 is wound around coil frame 331 thus mounted on terminal assembly 340 from above the latter, as illustrated in FIG. 5. The ends of coil 344 are coiled around terminals 341,342, respectively.

Support member 350 is made, for example, of synthetic resin and is substantially in the form of a rectangular parallelepiped. Support member 350 has a longitudinal end face 351 having upper and lower semi-circular cavities 352,353. Support member 350 is also shown in the plan view of FIG. 6.

Figure 6:
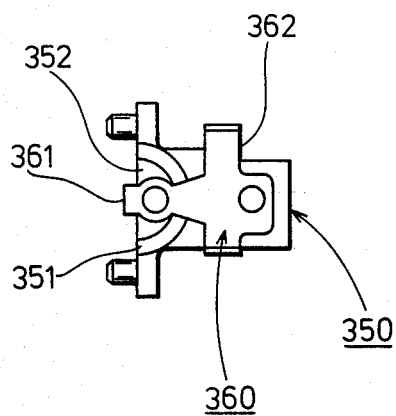
FIG. 6 is a plan view depicting a support member on which an upper clip is mounted.

Upper clip 360 is in the form of a cross-shaped plate of conductive material, and includes an arm 361 bent downwardly and other arms 362 bent upwardly, in the manner depicted. Arms 362 are bent upwardly for the reason that upper clip 360 can easily be gripped by an automatic assembling machine in the process of automatic assembling. As described later, terminal 341 of terminal assembly 340 is soldered to one of arms 362. Lower clip 370 is of substantially the same configuration as that of upper clip 360 for allowing them to be used interchangeably. Clip 360 is mounted, for example, by ultrasonic welding, on support member 350 with bent arm 361 positioned at end face 351 of support member 350, as illustrated in FIG. 6. Clip 360 is positioned on an upper surface of support member 350. Lower clip 370 is mounted on a lower surface of support member 350 with bent arm 371 spaced in confronting relation with bent arm 361 of clip 360, at end face 351 of support member 350.

Figure 7:
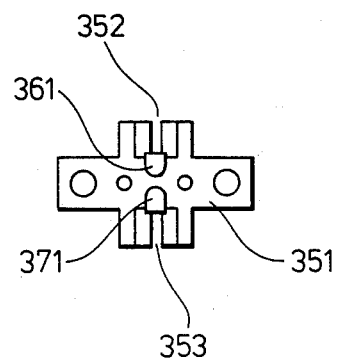
FIG. 7 is a front elevational view depicting the support member and showing an end surface thereof.

FIG. 7 is a front elevational view of end surface 351 of support member 350 with upper and lower clips 360 and 370 mounted thereon.

Figure 8:
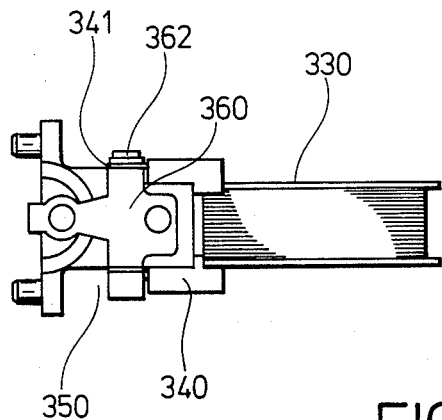
FIG. 8 is a plan view depicting the support member and other parts assembled thereon.

Terminal assembly 340 with coil frame 331 mounted thereon and coil 344 (see FIG. 5) wound around the latter is secured to a surface 356 of support member 350 which is remote from the end surface 351. Thus, one of terminals 341 is held against bent arm 362 of clip 360 mounted on support member 350, and terminal 342 is held against bent arm 372 of clip 370. Then, terminals 341 and 342 are soldered, respectively, to bent arms 362 and 372. FIG. 8 is a plan view of the support member 350 and other parts thus assembled.

Assembly of Units

The taut band is usually made of a variety of materials, such as PtNi, for example. Since the instrument according to the present invention is relatively thin in shape, the taut band needs to be short, resulting in poor creeping properties. To improve the creeping property, it is preferable to use a metal material having as a main component palladium (Pd) instead of PtNi. The taut band 380 as used in the invention, is preferably principally of palladium.

The taut band 380 has one end portion that has passed through slot 212 in bridge 210 (see FIG. 3) and recess 225 in boss stopper 220 and is inserted in hole 211 in bridge 210 and cylindrical portion 223 of upper boss stopper 220. The end portion, has its distal end extending along bent portion 242 of tension spring 240 and soldered to tongue 241. The other end portion of taut band 380 passes through recess 111 in yoke 110 and a recess 235 in boss stopper 230 into hole 112 in yoke 110 and a cylindrical portion 233 of lower boss stopper 230. The other end portion, has a distal end soldered to a tongue 251 of lower tension spring 250. Taut band 380 thus extends and is attached under a predetermined tension between upper and lower tension springs 240 and 250.

Figure 9:
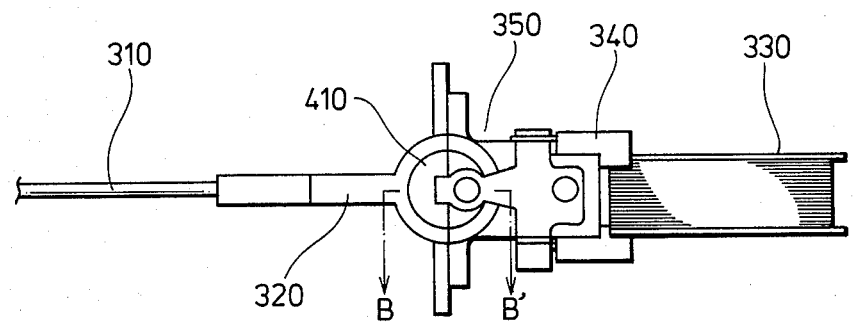
FIG. 9 is a plan view of an assembled moving unit.

Moving coil 330, terminal assembly 340, and support member 350 thus assembled, are coupled with pointer attachment 320, thereby constituting moving unit 330. The assembling process is effected as follows: Support member 350 is positioned such that bent arm 361 of clip 360 and bent arm 371 of clip 370, which are on end surface 351 of support member 350, are in contact with taut band 380. Taut band 380 is kept taut between the upper and lower tension springs 240 and 250. Then, taut band 380 is soldered to bent arms 361 and 371. Thereafter, taut band 380 is cut between bent arms 361 and 371. Pointer attachment 320 is brought into contact with support member 350 and joined thereto for example, by ultrasonic welding. Pointer 310 is then attached to pointer attachment portion 327 of pointer attachment 320. In this manner moving unit 300 is completely assembled. FIG. 9 is a plan view of the moving unit 300 thus assembled.

Figure 10:
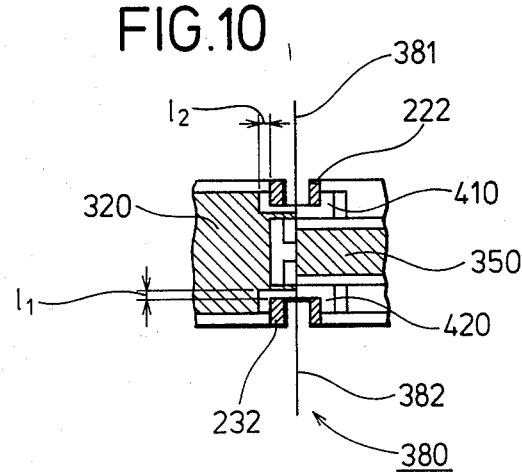
FIG. 10 depicts a fragmentary cross-sectional view taken along line B—B' in FIG. 9.

When pointer attachment 320 and support member 350 are coupled together, upper semi-circular cavities 322 and 352, jointly define a circular cavity 410, as shown in FIGS. 9 and 10. FIG. 10 is a cross sectional view taken along line B—B' in FIG. 9. In a similar manner, lower semi-circular cavities 323 and 353 of pointer attachment 320 and support member 350, respectively, define jointly a circular cavity 420 (not shown in FIG. 9). The smaller diameter portion 222 (see FIG. 4) of upper boss stopper 220 is disposed in upper cavity 410, and smaller diameter portion 232 of lower boss stopper 230 is disposed in lower cavity 420. Smaller diameter portions 222 and 232 are spaced a certain distance from each other, as shown.

Moving unit 300 is axially and laterally displaceable upon impact or when subjected to vibrations. The amount of axial displacement of moving unit 300 is limited to a gap or interval $l_1$ (see FIG. 10) defined between distal ends of smaller diameter portions 222 and 232 of boss stoppers 220 and 230 and flat bottom surfaces of cavities 410 and 420. The amount of lateral displacement of moving unit 300 is limited to a gap or interval $l_2$ between peripheral surfaces of smaller diameter portions 222 and 232 and inner walls of cavities 410 and 420. The taut band 380, which is cut into taut band members 381 and 382, is thus prevented from being cut off or fatigued.

Fabrication

The instrument of the invention may be fabricated in the following manner using the above components:

1. Bridge 210 is mounted on yoke 100 and permanent magnets 130 and 140 are attached, for example, by bonding, to yoke 110 at positions 130' and 240' thereon.

2. Upper tension spring 240 is secured to upper boss stopper 220, and then larger diameter portion 221 of boss stopper 220 is press fitted into hole 211 in bridge 210. Likewise, lower tension spring 250 is secured to lower boss stopper 230. Then, larger diameter portion 231 of boss stopper 230 is press fitted into hole 112 from below yoke 110.

3. Taut band 380 is attached to upper and lower tension springs 240 and 250, and is kept under a predetermined tension therebetween.

4. Coil 344 is wound around coil frame 331 of moving coil 330 to which terminal assembly 340 has been affixed. The ends of coil 344, as wound, are coiled around terminals 341 and 342, respectively.

5. Upper and lower clips 360 and 370 are attached to support member 350.

6. Terminal assembly 340 is coupled to support member 350, and terminals 341 and 342 are soldered respectively to clips 360 and 370.

7. Taut band 380 is soldered to bent arms 361 and 371 of clips 360 and 370, respectively. Then, taut band 380 is cut between bent arms 361 and 371.

8. The flat end surface of pointer attachment 320 is joined, for example, by ultrasonic welding, to the end surface 351 of support member 350.

9. Core 120 is inserted in moving coil frame 331, and then ends of core 120 are bonded to permanent magnets 130 and 140.

10. Pointer 310 is bonded to pointer attachment portion 327 of pointer attachment 320.

The instrument mechanisms thus assembled in the manner above stated, is shown in FIGS. 2A and 2B. The instrument mechanisms are then housed in casing comprising cover 1 and base 2, as shown in FIG. 1.

When an input to be measured is applied to an input terminal 31 (see FIG. 1), the input is delivered from tension spring 240 (see FIG. 3) to upper member of taut band 380 to coil 344 to lower member of taut band 380, to tension spring 250 and to terminal 32 (see FIG. 1). Moving unit 300 (see FIGS. 2A and 2B and FIG. 3) is caused to turn about taut band 380 for an angular interval dependent on the magnitude of the input applied, with the result that the pointer 310 indicates a value of input to be measured.

The conventional assembling process for such taut band type instrument involves dividing the taut band in advance into an upper and a lower member with one end of each taut band portion being attached to bosses through slits defined respectively therein, and the other end of each taut band portion being fastened to tension springs via holes in boss stoppers and a bridge which supports the boss stoppers. The taut band portions are thus attached to the moving unit.

In contrast, in this invention, the taut band 380 is first attached to and extends between the upper and lower tension springs, and is soldered to clips mounted on support member 350 with the moving coil installed thereon, and thereafter the taut band is cut into an upper and a lower taut band portions, to which support member is then attached the pointer attachment with a pointer mounted thereon.

The taut band instrument of this invention is advantageous over the prior taut band instruments in the following respects.

1. No separate procedure is need to thread a thin taut band through slits. Thus, the assembling process is considerably improved. 2. There is no need to solder the upper and lower taut band members separately to a moving unit. Thus, the number of steps required to fabricate the instrument is reduced.

3. The taut band type instrument of this invention can automatically be assembled using a machine. There are numerous other advantages to this invention.

The foregoing description is illustrative of the principles of this invention. Numerous other extensions and modifications thereof would be apparent to the worker skilled in the art. All such extensions and modifications are to be considered to be within the spirit and scope of this invention.

What is claimed is:

1. A taut band type instrument suitable for being automatically assembled, comprising
an exciting unit comprising a yoke having a hole defined therein, said hole communicating with an exterior through a recess, a pair of permanent magnets attached to said yoke and spaced from each other across said hole, and a semi-annular core attached to said pair of permanent magnets;
a bridge unit comprising a channel shaped bridge having a hole defined therein, said hole communicating with an exterior through a recess, said channel shaped bridge being attached to said yoke, upper and lower stoppers, each of said stoppers having a cylindrical portion communicating with an exterior through a recess, one of said stoppers being mounted in said hole in said bridge and the other stopper being mounted in said hole in said yoke, and upper and lower tension springs having tongues, respectively, and attached to said upper and lower stoppers, respectively;
a moving unit comprising a moving coil disposed angularly movably about said core, a support member to which said moving coil is attached, upper and lower clips fixed to said support member and electrically connected to terminals of said moving coil, a pointer, and a pointer attachment to which said pointer is attached, said pointer attachment and said support member being coupled at end surfaces thereof;

an upper taut band inserted, through said recesses in said bridge and said upper stopper, and within said hole of said bridge and within said cylindrical portion of said upper stopper, said upper taut band having one end attached to said upper tension spring through said tongue thereof and an opposite end attached to said upper clip;

a lower taut band inserted, through said recesses in said yoke and said lower stopper, and within said hole of said yoke and within said cylindrical portion of said lower stopper, said lower taut band having one end attached to said lower tension spring through said tongue thereof and an opposite end attached to said lower clip, said upper and lower taut band coacted with each other to support said moving coil under tension between said upper and lower tension springs;

whereby said pointer is angularly moved through an angular interval dependent on current to be measured, said current flowing through said moving coil, under coaction of a magnetic flux from said permanent magnets and said current to be measured.

2. The instrument of claim 1, wherein said upper and lower taut bands are made of a metal material containing palladium as a main component.

* * * * *